United States Patent [19]

Campbell

[11] Patent Number: 4,661,722
[45] Date of Patent: Apr. 28, 1987

[54] FAIL-SAFE PULSE COINCIDENCE DETECTOR

[75] Inventor: Richard D. Campbell, Swissvale, Pa.

[73] Assignee: American Standard Inc., North Hills, Pa.

[21] Appl. No.: 651,731

[22] Filed: Sep. 17, 1984

[51] Int. Cl.$^4$ .................................. H02M 5/10
[52] U.S. Cl. ........................... 307/419; 307/411; 307/412; 307/415; 361/88
[58] Field of Search ................ 307/403–423, 307/282, 314; 340/253–257; 246/161 R; 363/22, 23, 97, 133; 331/114, 113 R, 113 A; 361/88

[56] References Cited

U.S. PATENT DOCUMENTS

| | | | |
|---|---|---|---|
| 2,803,759 | 8/1957 | Kreuder | 307/419 X |
| 2,819,352 | 1/1958 | Houck | 307/416 X |
| 2,846,593 | 8/1958 | Sands | 307/411 |
| 2,913,594 | 11/1959 | Eckert | 307/407 |
| 2,925,500 | 2/1960 | Meyerhoff | 307/411 |
| 2,978,592 | 4/1961 | Kilburn et al. | 307/415 |
| 3,010,028 | 11/1961 | Meyenhoff et al. | 307/419 |
| 3,084,263 | 4/1963 | Weg et al. | 307/415 |
| 3,117,308 | 1/1964 | Sublette | 307/423 X |
| 3,129,336 | 4/1964 | Constantine | 307/415 |
| 3,132,256 | 5/1964 | Giel | 307/419 |
| 3,166,677 | 1/1965 | Morris | 307/413 |
| 3,193,691 | 7/1965 | Akmenkalns | 307/412 |
| 3,207,911 | 9/1965 | Gerlach et al. | 307/422 |
| 3,221,187 | 11/1965 | Clifton | 307/415 X |
| 3,555,257 | 1/1971 | Gray | 307/411 X |
| 3,754,274 | 8/1973 | Auger | 307/412 X |
| 3,999,104 | 12/1976 | Lardennois | 361/88 |

Primary Examiner—William M. Shoop, Jr.
Assistant Examiner—Shik Luen Paul Ip
Attorney, Agent, or Firm—J. B. Sotak

[57] ABSTRACT

A fail-safe electronic coincidence detecting circuit including a multiple winding saturable core reactor having a first and a second input winding and an output winding. An NPN transistor amplifier supplying a first pulse train to the first input winding and a PNP transistor amplifier supplying a second pulse train to the second input winding. The output winding producing signal pulses only when the first and second pulse trains are in synchronism.

9 Claims, 2 Drawing Figures

FAIL-SAFE PULSE COINCIDENCE DETECTOR

FIELD OF THE INVENTION

This invention relates to a vital coincidence detecting circuit and more particularly to a fail-safe, two-pulse coincidence detector having a multi-winding saturable core reactor for producing an output signal across an output winding only when two signal pulses are simultaneously applied to a pair of input windings.

BACKGROUND OF THE INVENTION

In certain signal and control systems, such as audio frequency (AF) train detection and cab signal operations, it is mandatory to ensure the safety and security of the crewmen and/or passengers as well as to protect the system and apparatus against damage and/or destruction by a false or unsafe condition. Thus, it is essential to exercise extreme care in designing the circuitry and in selecting the components of the electronic track circuit equipment to ensure fail-safe operation. For example, these precautionary measures should be implemented on each and every portion or circuit which makes up a vital system. In one application, it is required to compare two trains of pulses which emanate from two different supply sources. One such case is the comparison of the outputs of two unijunction oscillators to determine if the oscillators are running in synchronism. As noted above, it is mandatory that the comparison, verification, or coincidence check be carried out in a fail-safe manner.

OBJECTS AND SUMMARY OF THE INVENTION

Accordingly, it is an object of this invention to provide a new and improved fail-safe pulse coincidence detecting circuit.

Another object of this invention is to provide a unique vital coincidence detector which produces an output only when a pair of pulse trains are in synchronism.

A further object of this invention is to provide a novel fail-safe pulse coincidence detector for comparing the presence of two concurrent inputs in order to produce an output.

Still another object of our invention is to provide an electronic coincidence detecting circuit which operates in a fail-safe manner in that a critical component or circuit failure will not result in an unsafe condition.

Still a further object of this invention is to provide a vital two-pulse coincidence detecting circuit which produces an output signal when and only when a pair of synchronous input pulses are present.

Yet another object of this invention is to provide a new vital coincidence detector which includes a saturable magnetic core having a pair of input windings for receiving a pair of synchronous pulse trains which causes output pulses to be induced in an output winding.

Yet a further object of this invention is to provide a vital coincidence detecting circuit comprising a saturable reactor having at least a pair of input windings and an output winding, one of the pair of input windings receiving a first train of pulses, the other of said pair of input windings receiving a second train of pulses, and said output winding producing signal pulses only when the first and second trains of pulses are substantially in synchronism.

BRIEF DESCRIPTION OF THE DRAWINGS

The foregoing objects and other attendant features and advantages will be more readily apparent and appreciated as the subject invention becomes more clearly understood by reference to the following detailed description when considered in conjunction with the accompanying drawings, wherein.

DETAILED DESCRIPTION OF THE INVENTION

Figure 1:
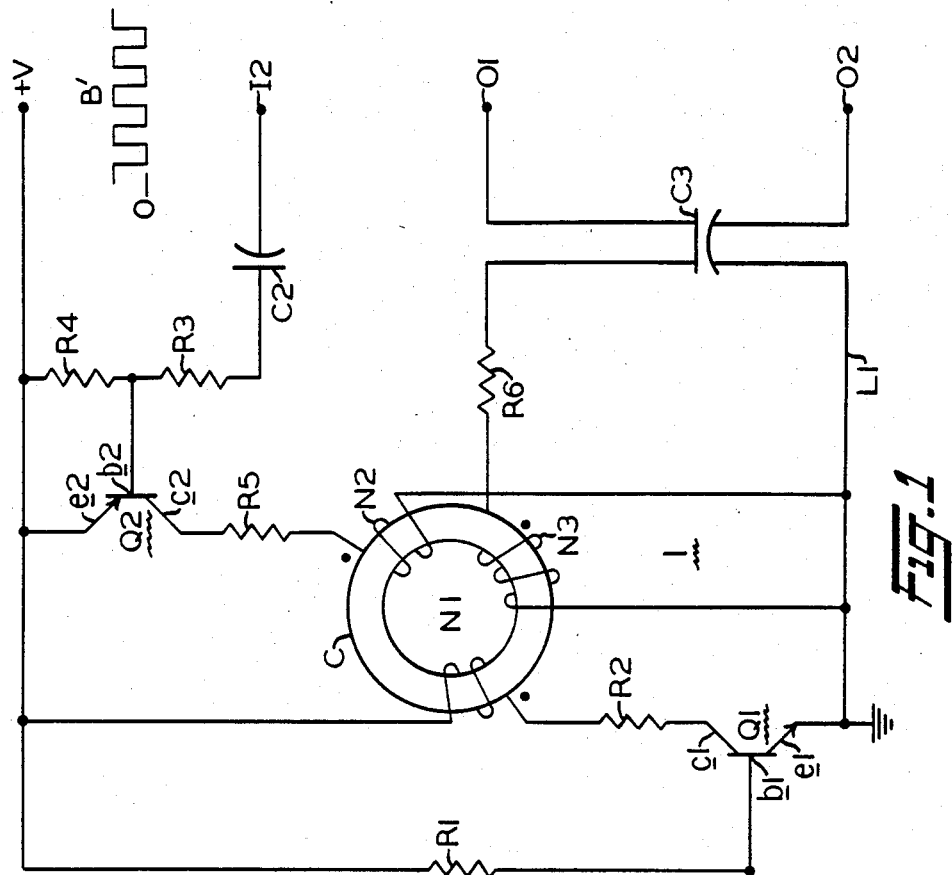
FIG. 1 is a schematic circuit diagram of a fail-safe, two-input coincidence detecting circuit in accordance with the present invention.

Referring now to the drawings and, in particular, to FIG. 1, there is shown a vital or fail-safe electronic multiple-pulse coincidence detector which is generally characterized by numeral 1. The coincidence detecting circuit 1 includes a pair of transistor amplifiers and a multiple winding saturated core reactor. The first amplifier includes an NPN transistor Q1 having a base electrode b1, a collector electrode c1, and an emitter electrode e1. The base electrode b1 of transistor Q1 is connected to the input terminal I1 of a first source of negative square-wave pulses A' via a coupling capacitor C1. The base electrode b1 is also connected to a suitable source of d.c. operating voltage +V via a biasing resistor R1. The emitter electrode e1 of transistor amplifier Q1 is directly connected to ground line L1. The collector electrode c1 of transistor Q1 is connected to the positive voltage terminal +V via a load resistor R2 and a series-connected control coil or first winding N1 of a tape-wound magnetic core C. The annular core C is constructed of permalloy which has a square hysteresis loop. The saturable core reactor C includes a second control coil or winding N2 and a third output coil or winding N3.

As shown, the second amplifier includes a PNP transistor Q2 having a base electrode b2, a collector electrode c2, and an emitter electrode e2. The base electrode b2 is connected to the input terminal I2 of a second source of negative square-wave pulses B' via a coupling capacitor C2 and series resistor R3. The base electrode b2 is also connected to the positive supply terminal +V via biasing resistor R4. The emitter electrode e2 is directly connected to voltage terminal +V while the collector electrode c2 is connected to ground line L1 via a series circuit including load resistor R5 and the second control winding or coil N2.

It will be seen that the one end of the output winding N3 is connected by a current limiting resistor R6 to on terminal of the upper plate of a four-terminal capacitor C3. The other end of winding N2 and the one terminal of the lower plate of capacitor C3 are directly connected to ground line L1. As shown, the other terminals of the upper and lower plates of capacitor C3 are connected to output terminals O1 and O2, respectively. It will be appreciated that output signal pulses are developed on the output terminals O1 and O2 only when the two trains of input signal pulses A' and B' have substantially the same frequency and are substantially in synchronism, as will be described presently.

Figure 2:
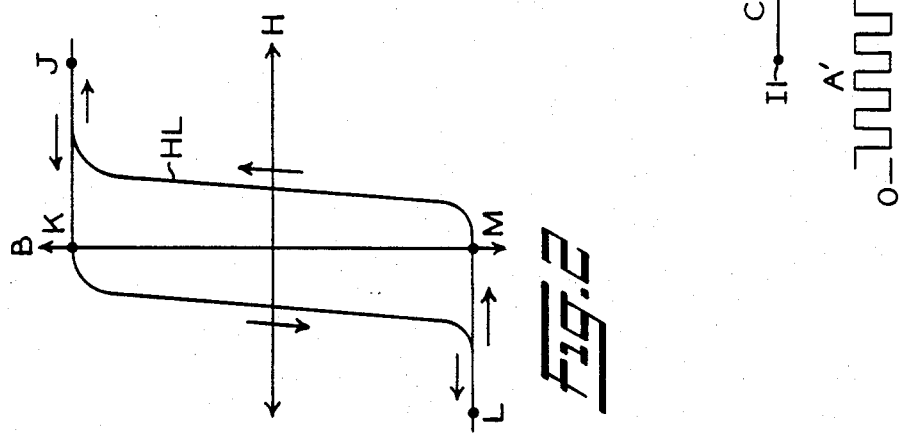
FIG. 2 illustrates the dynamic rectangular hystersis loop of a saturable core reactor employed in the coincidence detecting circuit of FIG. 1.

In describing the operation of the fail-safe coincidence pulse detector, it will be assumed that the circuit is intact and functioning properly, that the supply voltage is applied to the circuit, and that the two trains of pulses A' and B' are locked together and are applied to input terminals I1 and I2, respectively. Under this condition, the transistor Q1 is initially conducting while the transistor Q2 is turned off since both of the pulse trains are initially positive. The conduction of transistor Q1 causes the core C to go into a saturated condition. That is, the core is saturated by ampere-turns N1I1 so that the core goes to point J as shown on the hysteresis loop HL in FIG. 2. Now when a pulse of train A' goes in the negative direction to zero (0), the transistor Q1 is turned off, and the core goes from point J to point K on the hysteresis loop HL since the ampere-turns N1I1 is equal to zero. It will be appreciated that the transition from point J to point K produces no output voltage since this portion of the curve is entirely horizontal. Now if the synchronous pulse of train B' goes in the negative direction to zero (0), the transistor Q2 is rendered conductive and causes a magnetomotive force of $-N2I2$ ampere-turns. This flux drives the core C from point K to point L, which induces a large output pulse across winding N3 and produces a positive output voltage on terminals O1 and O2. Now if a synchronous pulse of train A' goes positive, the transistor Q1 is rendered conductive so that core C goes from point L to point M since the ampere-turns $-N2I2$ are nullified by ampere-turns N1I1. If, at substantially the same time, the pulse of train B' goes positive, the core again goes to point J due to the ampere-turns N1I1 and a large negative pulse is produced across winding N3 and terminals 01 and 02. Thus, as long as the pulses of trains A' and B' continue to be substantially in synchronism, output pulses will continue to be developed on terminals O1 and O2. In practice, the circuit is designed to allow a variation of approximately ten percent (10%) phase differential between the pulses of trains A' and B'; however, in actuality, output pulses will be generated as long as overlap exists between pulses of each train. However, if the two-pulse trains lose synchronism, then there will only be an occasional spurious output pulse produced across terminals O1 and O2, namely, when the pulses of trains A' and B' happen to overlap. If the pulses are deliberately chosen to be very narrow, then the spurious outputs will only occur on rare occasions.

It will be appreciated that if the two pulses do not occur simultaneously, either one of the pulses, by itself, can bring the core out of saturation, but will not cause a flux reversal and saturate it in the opposite direction so that no appreciable output will be induced in winding N3. That is, if either one of the pulse trains disappears due to an open or short circuit, then at most a single output pulse will be produced and, thereafter, the operating point will move back and forth either between points J and K or between points L and M, so that no output pulses will be developed on terminals O1 and O2. Thus, the circuit operates in a fail-safe manner in that no foreseeable critical component or circuit failure is capable of causing a false or unsafe condition. That is, an unsafe malfunction will not produce output pulses on terminals O1 and O2 when either one or both of the synchronous pulse trains A' and B' are not present on the input terminals I1 and I2, respectively.

Thus, the present circuit has been described in such clear and exact terms as to enable a skilled artisan to which the invention relates to make and use the same. It will be appreciated that the details of the invention which have been disclosed and described in the accompanying drawing and foregoing description are considered as illustrative and not restrictive in nature. Accordingly, it is understood that various alterations may be made by persons skilled in the art without departing from the spirit and scope of this invention. Thus, it is apparent that certain modifications and changes can be made to the presently described invention, and therefore it is understood that alterations, equivalents and substitutions producing the same results in substantially the same manner with substantially the same features are herein meant to be included by the appended claims.

Having thus described my invention, what I claim as new and desire to secure by Letters Patent, is:

1. A vital coincidence detecting circuit comprising, a saturable core reactor having at least a pair of input windings and an output winding, one source of a first train of pulses, another source of a second train of pulses which are in concurrence with the first train of pulses, one of said pair of input windings receiving the first train of pulses from one type of transistor amplifier, the other of said pair of input windings receiving the second train of pulses from a complementary type of transistor amplifier, and said output winding producing signal pulses only when the first and second trains of pulses are substantially in synchronism to cause said one type of transistor amplifier to be rendered conductive while causing said complementary type of transistor amplifier to be rendered nonconductive and to alternately cause said one type of transistor amplifier to be rendered nonconductive while causing said complementary type of transistor amplifier to be rendered conductive.

2. The vital coincidence detecting circuit, as defined in claim 1, wherein said one type of transistor amplifier includes an NPN transistor.

3. The vital coincidence detecting circuit, as defined in claim 2, wherein said NPN transistor includes a base electrode which is capacitively coupled to said first train of pulses and resistively connected to a source of operating voltage, a collector electrode which is resistively connected to said one of said pair of input windings, and an emitter electrode which is directly connected to ground.

4. The vital coincidence detecting circuit, as defined in claim 1, wherein said complementary type of transistor amplifier includes a PNP transistor.

5. The vital coincidence detecting circuit, as defined in claim 4, wherein said PNP transistor includes a base electrode which is capacitively-resistively coupled to said second train of pulses and resistively connected to a source of operating voltage, a collector electrode which is resistively connected to said other of said pair of input windings, and an emitter electrode is directly connected to said source of operating voltage.

6. The vital coincidence detecting circuit, as defined in claim 1, wherein a NPN transistor amplifier supplies said first train of pulses to said one of said pair of input windings and a PNP transistor amplifier supplies said second train of pulses to said other of said pair of input windings.

7. The vital coincidence detecting circuit, as defined in claim 6, wherein said saturable reactor includes a tape-wound permalloy core which is saturated in one direction by the conduction of said NPN transistor amplifier.

8. The vital coincidence detecting circuit, as defined in claim 7, wherein said core is saturated in the other direction by the conduction of said PNP transistor amplifier.

9. The vital coincidence detecting circuit, as defined in claim 1, wherein said output winding is connected to a pair of output terminals by a series resistor and a four-terminal capacitor.

* * * * *